United States Patent

Kimura et al.

[11] Patent Number: 5,814,534
[45] Date of Patent: *Sep. 29, 1998

[54] METHOD OF DOPING WITH BERYLLIUM AND METHOD OF FABRICATING SEMICONDUCTOR OPTICAL ELEMENT DOPED WITH BERYLLIUM

[75] Inventors: Tatsuya Kimura; Takao Ishida, both of Itami, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 510,695

[22] Filed: Aug. 3, 1995

[30] Foreign Application Priority Data

Aug. 5, 1994 [JP] Japan .................................. 6-184734

[51] Int. Cl.$^6$ .................................................. H01L 21/00
[52] U.S. Cl. ................................ 438/46; 438/41; 438/45; 438/681
[58] Field of Search ............................. 257/94, 96, 102; 438/46, 41, 45, 681, 680

[56] References Cited

U.S. PATENT DOCUMENTS

| | | | |
|---|---|---|---|
| 3,783,054 | 1/1974 | Marlett et al. | 149/109 |
| 5,202,283 | 4/1993 | Younger et al. | 117/95 |
| 5,358,897 | 10/1994 | Valster et al. | 257/94 |
| 5,369,289 | 11/1994 | Tamaki et al. | 257/99 |
| 5,565,693 | 10/1996 | Sasaki et al. | 257/94 |
| 5,679,603 | 10/1997 | Kimura et al. | 437/133 |
| 5,686,738 | 11/1997 | Moustakas | 257/103 |
| 5,708,301 | 1/1998 | Iyechika et al. | 257/44 |

FOREIGN PATENT DOCUMENTS

| | | |
|---|---|---|
| 0138963 | 5/1988 | European Pat. Off. . |
| 61-131582 | 6/1986 | Japan . |
| 62-32679 | 2/1987 | Japan . |
| 63-285991 | 11/1988 | Japan . |
| 3175687 | 7/1991 | Japan . |
| 04283979 | 8/1992 | Japan . |

OTHER PUBLICATIONS

Tejwani et al., Growth And Diffusion Of Abrupt Beryllium–Doped Profiles In Gallium Arsenide by Organometallic Vapor Phaser Epitaxy, Applied Physics Letters, vol. 53, No. 24, 1988, pp. 2411–2413.

Ohtsuka et al., "Extremely High Be Doping Of InGaAs By Low–Temperature Atomic Layer Epitaxy", Journal of Crystal Growth, vol. 115, 1991, pp. 460–463.

Weyers et al., "Gaseous Dopant Sources in MOMBE/CBE", Journal of Crystal Growth, Vo. 105, No. 1, Oct. 1, 1990, pp. 383–392.

Kimura et al., "Metalorganic Vapor Phase Epitaxy Growth of Be–Doped InP Using Bismethylcyclopentadienyl–Berylium", vol. 34, No. 2b, Feb. 1995, pp. 1106–1108.

Primary Examiner—John Niebling
Assistant Examiner—Long Pham
Attorney, Agent, or Firm—Leydig, Voit & Mayer

[57] ABSTRACT

In a method for doping with beryllium, when epitaxially growing a III-V compound semiconductor, $(MeCP)_2Be$ is employed as a dopant source. Since $(MeCP)_2Be$ has a lower vapor pressure than diethylberyllium (DEBe) which is conventionally employed as the dopant source doping control is facilitated. In addition, since $(MeCP)_2Be$ having a higher purity than DEBe is easily obtained, impurities such as oxygen are not incorporated into the active layer during doping, whereby a high quality p type layer is realized.

8 Claims, 15 Drawing Sheets

5,814,534

METHOD OF DOPING WITH BERYLLIUM AND METHOD OF FABRICATING SEMICONDUCTOR OPTICAL ELEMENT DOPED WITH BERYLLIUM

FIELD OF THE INVENTION

The present invention relates to a method for doping beryllium (Be) into a III-V compound semiconductor crystal when growing the III-V compound semiconductor and, more particularly, to a Be doping method that is easy to control.

The present invention further relates to a method for fabricating a semiconductor optical element employing a Be doping method that is easy to control, and a semiconductor optical element that is fabricated by this method.

BACKGROUND OF THE INVENTION

In crystal growth of a III-V compound semiconductor employing metal organic chemical vapor deposition (hereinafter, referred to as MOCVD), zinc (Zn) is frequently employed as a p type dopant. However, it is difficult to obtain a sharp profile of Zn. The diffusion coefficient of Zn is as large as $4 \times 10^{-14}$ cm$^{-2}$/s at 700° C. in GaAs, resulting in rapid movement of Zn in the crystal, so that it is impossible to obtain a device structure that is as designed. In addition, when Zn is employed as a p type dopant in a p type cladding layer in a semiconductor laser, the p type dopant diffuses to the active layer, thereby deteriorating emission efficiency of the semiconductor laser.

When Zn is added to an AlGaInP crystal, the amount of Zn as a dopant is required to be equal to the amount of Al+Ga+In as host atoms, whereby doping efficiency is low.

In molecular beam epitaxy (hereinafter, referred to as MBE), Be, which is harder to diffuse than Zn, has been employed as a p type dopant and also in MOCVD, as a p type dopant has been investigated.

In Journal of Crystal Growth 77(1986) pp.32–36 North-Holland, Amsterdam, "MOVPE GROWTH OF BERYLLIUM-DOPED GALLIUM ARSENIDE USING DIETHYLBERYLLIUM", a study concerning Be doping when growing GaAs by MOCVD is described. In this reference, diethylberyllium (hereinafter, referred to as DEBe) is employed as a dopant source material. In other references, such as Appl. Phys. Lett. 53(24), 12 Dec. 1998, pp.2411–2413, Be doping when growing a III-V compound semiconductor by MOCVD is also described. In these references, DEBe is employed as the source of Be.

In Be doping during growth of a III-V compound semiconductor in the prior art described above, DEBe is employed as the organic metal compound including Be. Since incorporation of oxygen during production of DEBe cannot be avoided, it is difficult to increase the purity of the organic metal compound. Therefore, in prior art Be doping using DEBe, oxygen is incorporated into the crystal as an impurity during doping, unfavorably affecting electrical characteristics of the device.

In addition, although a lower vapor pressure of the dopant source is easy to achieve for doping control, the vapor pressure of DEBe is not low enough handling.

SUMMARY OF THE INVENTION

It is an object of the present invention to provide a beryllium doping method that enables high quality beryllium doping more easily.

It is another object of the present invention to provide a method for fabricating a semiconductor optical element that provides an easy fabrication of a high performance device.

It is still another object of the present invention to provide a semiconductor optical element with a high quality beryllium doped layer.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, in a method of doping beryllium, when epitaxially growing a III-V compound semiconductor, an organic metal compound of $(CH_3C_5H_4)_2Be$ ($=(MeCP)_2Be$ : bis methylcyclopentadienyl beryllium) is employed as a dopant source for doping beryllium in the III-V compound semiconductor crystal. Since $(MeCP)_2Be$ has a lower vapor pressure than diethylberyllium (DEBe) which is conventionally employed as the dopant source for doping beryllium, doping control is facilitated. In addition, since $(MeCP)_2Be$ of higher purity than DMBe is easily obtained, impurities such as oxygen that are incorporated into the active layer during doping are suppressed, whereby a high quality p type layer is realized.

According to a second aspect of the present invention, in a method of doping beryllium, when epitaxially growing a III-V group compound semiconductor by any one of MOCVD, MOMBE, and CBE, $(MeCP)_2Be$ is employed as the dopant source for doping beryllium into the III-V compound semiconductor crystal. Therefore, a high quality p type layer is easily realized by any one of MOCVD, MOMBE, and CBE.

According to a third aspect of the present invention, in a method of fabricating a semiconductor optical element, when fabricating a semiconductor optical element by epitaxially growing a p type layer and an n type layer each comprising a III-V compound semiconductor on a substrate by CBE, beryllium doping is performed from $(MeCP)_2Be$ to form the p type layer. Therefore, a high quality p type layer is easily realized and a high performance semiconductor optical element is obtained.

According to a fourth aspect of the present invention, in a method of fabricating a semiconductor optical element, when fabricating a semiconductor long wavelength laser by epitaxially growing a p type layer and an n type layer each comprising a III-V compound semiconductor on a p type InP substrate by CBE, beryllium doping is performed from $(MeCP)_2Be$ to form the p type layer. Therefore, a high quality p type layer is easily realized and a high performance semiconductor long wavelength laser employing a p type InP substrate is obtained.

According to a fifth aspect of the present invention, in a method of fabricating a semiconductor optical element, when fabricating a semiconductor long wavelength laser by epitaxially growing a p type layer and an n type layer each comprising a III-V compound semiconductor on an n type InP substrate by CBE, beryllium doping is performed from $(MeCP)_2Be$ to form the p type layer. Therefore, a high quality p type layer is easily realized and a high performance semiconductor long wavelength laser employing an n type InP substrate is obtained.

According to a sixth aspect of the present invention, in a method of fabricating a semiconductor optical element, when fabricating a semiconductor visible light laser by epitaxially growing a p type layer and an n type layer each comprising a III-V compound semiconductor on an n type GaAs substrate by CBE, beryllium doping is performed from $(MeCP)_2Be$ to form the p type layer. Therefore, a high quality p type layer is easily realized and a high performance semiconductor visible light laser employing an n type GaAs substrate is obtained.

According to a seventh aspect of the present invention, in a method of fabricating a semiconductor optical element, when fabricating a semiconductor short wavelength laser by epitaxially growing a p type layer and an n type layer each comprising a III-V compound semiconductor on an n type GaAs substrate by CBE, beryllium doping is performed from $(MeCP)_2Be$ to form the p type layer. Therefore, a high quality p type layer is easily realized and a high performance semiconductor short wavelength laser employing an n type GaAs substrate is obtained.

According to an eighth aspect of the present invention, in a method of fabricating a semiconductor optical element, when fabricating a semiconductor blue light emission diode by epitaxially growing a p type layer and an n type layer each comprising a III-V compound semiconductor on a sapphire substrate by CBE, beryllium doping is performed from $(MeCP)_2Be$ to form the p type layer. Therefore, a high quality p type layer is easily realized and a high performance semiconductor blue light emission diode employing a sapphire substrate is obtained.

According to a ninth aspect of the present invention, in a semiconductor optical element including a p type layer and an n type layer each comprising a III-V compound semiconductor epitaxially grown on a substrate, beryllium doping is performed from $(MeCP)_2Be$ to form the p type layer. Therefore, a semiconductor optical element having less degradation of optical characteristics due to diffusion of p type dopants into the active layer is easily realized.

According to a tenth aspect of the present invention, in a semiconductor long wavelength laser including a p type layer and an n type layer each comprising a III-V compound semiconductor epitaxially grown on a p type InP substrate, beryllium doping is performed from $(MeCP)_2Be$ to form the p type layer. Therefore, a semiconductor long wavelength laser employing a p type InP substrate having less degradation of optical characteristics due to diffusion of p type dopants into the active layer is easily realized.

According to an eleventh aspect of the present invention, in a semiconductor long wavelength laser including a p type layer and an n type layer each comprising a III-V compound semiconductor epitaxially grown on an n type InP substrate, beryllium doping is performed from $(MeCP)_2Be$ to form the p type layer. Therefore, a semiconductor long wavelength laser employing an n type InP substrate having less degradation of optical characteristics due to diffusion of p type dopants into the active layer is easily realized.

According to a twelfth aspect of the present invention, in a semiconductor visible light laser including a p type layer and an n type layer each comprising a III-V compound semiconductor epitaxially grown on an n type GaAs substrate, beryllium doping is performed from $(MeCP)_2Be$ to form the p type layer. Therefore, a semiconductor visible light laser employing an n type GaAs substrate having less degradation of optical characteristics due to diffusion of p type dopants into the active layer is easily realized.

According to a thirteenth aspect of the present invention, in a semiconductor short wavelength laser including a p type layer and an n type layer each comprising a III-V compound semiconductor epitaxially grown on an n type GaAs substrate, beryllium doping is performed from $(MeCP)_2Be$ to form the p type layer. Therefore, a semiconductor short wavelength laser employing an n type GaAs substrate having less degradation of optical characteristics due to diffusion of p type dopants into the active layer is easily realized.

According to a fourteenth aspect of the present invention, in a semiconductor blue light emission diode including a p type layer and an n type layer each comprising a III-V compound semiconductor epitaxially grown on a sapphire substrate, beryllium doping is performed from $(MeCP)_2Be$ to form the p type layer. Therefore, a semiconductor blue light emission diode employing a sapphire substrate having less degradation of optical characteristics due to diffusion of p type dopants into the active layer is easily realized.

DETAILED DESCRIPTION OF THE PREFERRED EMBODIMENT

Embodiment 1

A description is given of a Be doping method according to a first embodiment of the present invention.

In the first embodiment, when InP is grown, $(CH_3C_5H_4)_2Be$ ($=(MeCP)_2Be$ : bis-methylcyclopentadienyl beryllium) is employed as an organic compound including Be as in doping source for an InP crystal.

Bis-methylcyclopentadienyl beryllium (hereinafter, referred to as $(MeCP)_2Be$) is a liquid at room temperature and has a vapor pressure of about 0.05 torr.

Figure 1:
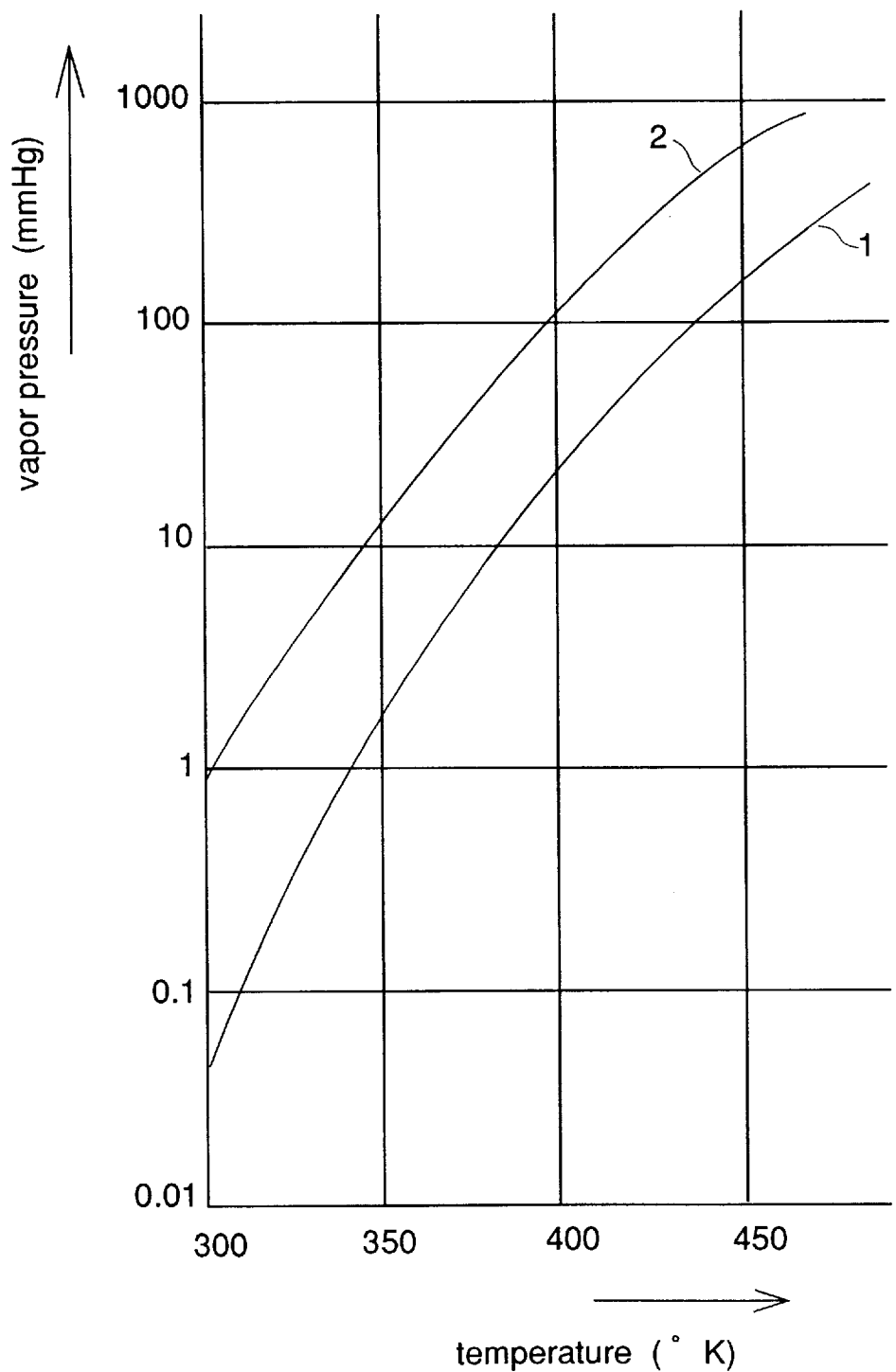
FIG. 1 is a graph showing vapor pressure of $(MeCP)_2Be$ and DEBe.

FIG. 1 is a graph comparatively showing vapor pressures of $(MeCP)_2Be$ and DEBe, in which curve 1 represents the vapor pressure of $(MeCP)_2Be$ and curve 2 represents the vapor pressure of DEBe. In FIG. 1, the vapor pressure of $(MeCP)_2Be$ is lower than that of DEBe, and at room temperature (300° K.) it is less than that at least one factor of ten.

The doping gas is easily handled at a lower vapor pressure, whereby the supply of doping gas is easily controlled and, particularly, when fine doping control is required, this advantage is very useful.

In this embodiment, employing $(MeCP)_2Be$ as a dopant source, controllability is improved as compared with the prior art Be doping employing DEBe as a dopant source.

When there are a large number of C and H atoms, since metal compounds and organic compounds are easy to thermally decompose, $(MeCP)_2Be=(CH_3C_5H_4)_2Be$ is easier to decompose at a lower temperature than DEBe $=(C_2H_5)_2Be$. However, this decomposition occurs at a temperature exceeding 100° C., since $(MeCP)_2Be$ is stable at a temperature lower than 100° C. In a case where a metal compound and a organic compound are not thermally decomposed at to a high temperature, the metal element and the organic element, especially carbon (C), are easy to incorporate into the crystal. In a semiconductor material in which C serves as an acceptor in the crystal, such as GaAs, the incorporation of C offers no problem. On the contrary, in a semiconductor material in which C serves as a donor in the crystal, such as InP, Be is compensated by C when Be and C are incorporated into the crystal, resulting in a reduction in the p type carrier concentration. In this embodiment where $(MeCP)_2Be$ is employed as the dopant source of Be, since $(CH_3C_5H_4)$ is decomposed at a low temperature, C is not easily incorporated into the crystal, an unwanted reduction in the p type carrier concentration is suppressed due to the reduced compensation of Be by C.

A description is given of a doping characteristic during doping of Be employing $(MeCP)_2Be$, when growing an InP layer by MOCVD.

Figure 2:
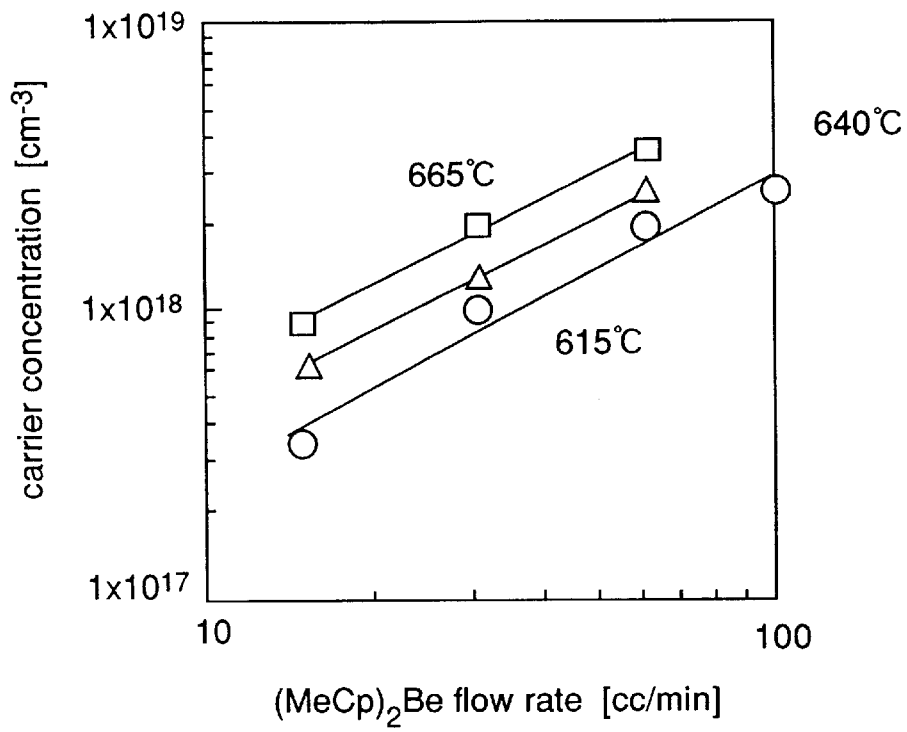
FIG. 2 is a graph showing Be doping characteristics employing $(MeCP)_2Be$ as a dopant source.

FIG. 2 is a graph showing a doping characteristic of Be, in which a growth temperature of InP grown at a growth pressure of 76 torr and V/III ratio of 100 serves as a parameter. Hole concentration increases linearly with an increase in the supply amount of $(MeCP)_2Be$, namely in the amount of $H_2$ carrier gas. In addition, the hole concentration is increased with an increase in the growth temperature. In the case of InP, although the hole concentration is saturated at a dopant concentration of $4 \times 10^{18} cm^{-3}$, linearity of doping is maintained up to the saturated region. A hole concentration of $3 \times 10^{18} cm^{-3}$ is obtained at a growth temperature of 665° C. with a supply amount of $(MeCP)_2Be$ of 60 cc/min. The surface morphology of the all grown samples is a mirror surface.

Figure 3:
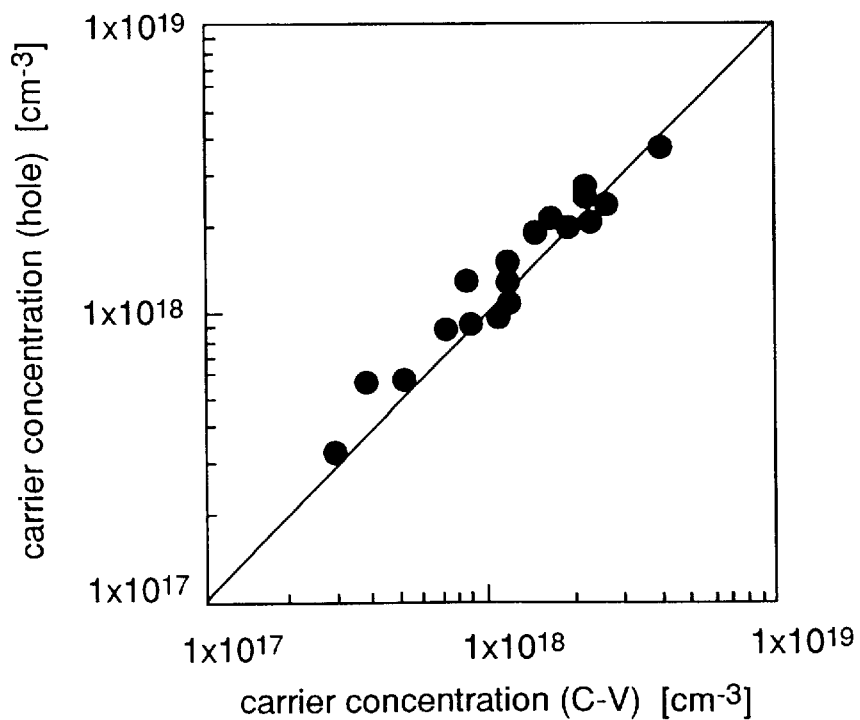
FIG. 3 is a graph showing a relation between carrier concentration by Hall measurement and carrier concentration while C-V measurement, of Be doped InP grown by employing $(MeCP)_2Be$ as a dopant source.

FIG. 3 is a graph showing a relation between carrier concentration measured by a hole measurement and carrier concentration measured by a capacitance-voltage (C-V) measurement, of Be doped InP grown employing $(MeCP)_2Be$ as the source of Be. As shown in FIG. 3, the hole concentration is nearly the same as the ionized dopant concentration. This almost no impurity except for Be, such as oxygen, is incorporated.

Figure 4:
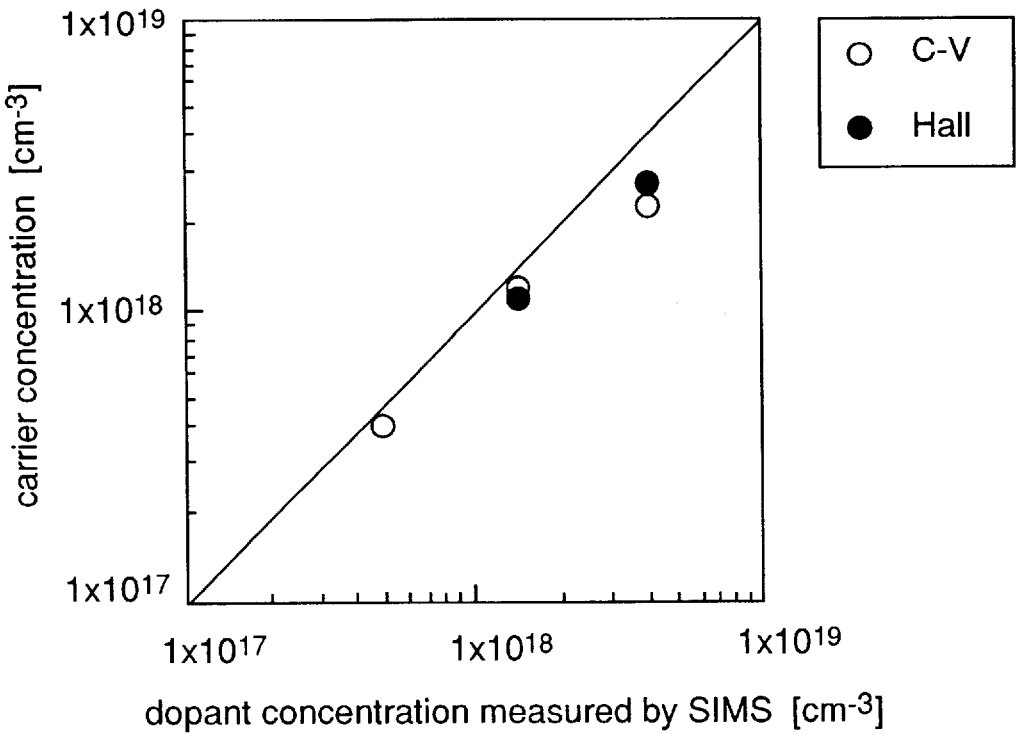
FIG. 4 is a graph showing a relation between carrier concentration, and dopant concentration measured by SIMS, of Be doped InP grown by while employing $(MeCP)_2Be$ as a dopant source.

FIG. 4 is a graph showing a relation between dopant concentration measured by SIMS and carrier concentration measured by a Hall measurement or C-V measurement, of Be doped InP grown employing $(MeCP)_2Be$ as the source of Be. As shown in FIG. 4, an activation rate of Be in InP is nearly 1 and the Be atoms are all ionized.

In the experiment, it is confirmed that the doping efficiency of Be employing $(MeCP)_2Be$ is 7–8 times higher than that of Zn employing DEZn.

Figure 5:
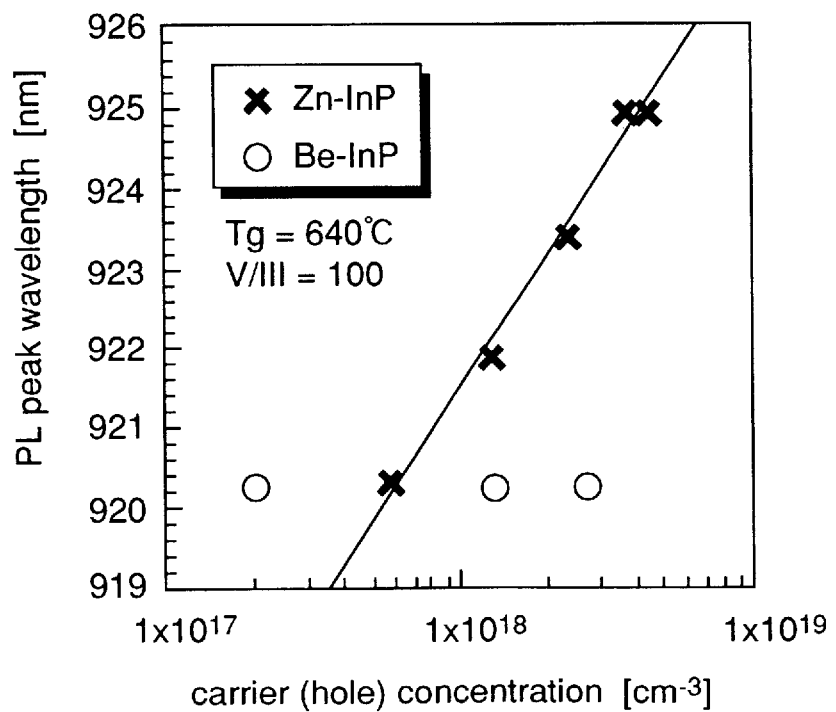
FIG. 5 is a graph showing a relation between hole concentration and PL peak wavelength, of Be doped InP grown by employing $(MeCP)_2Be$ as a dopant source and Zn doped InP grown while employing DEZn as a dopant material.
Figure 6:
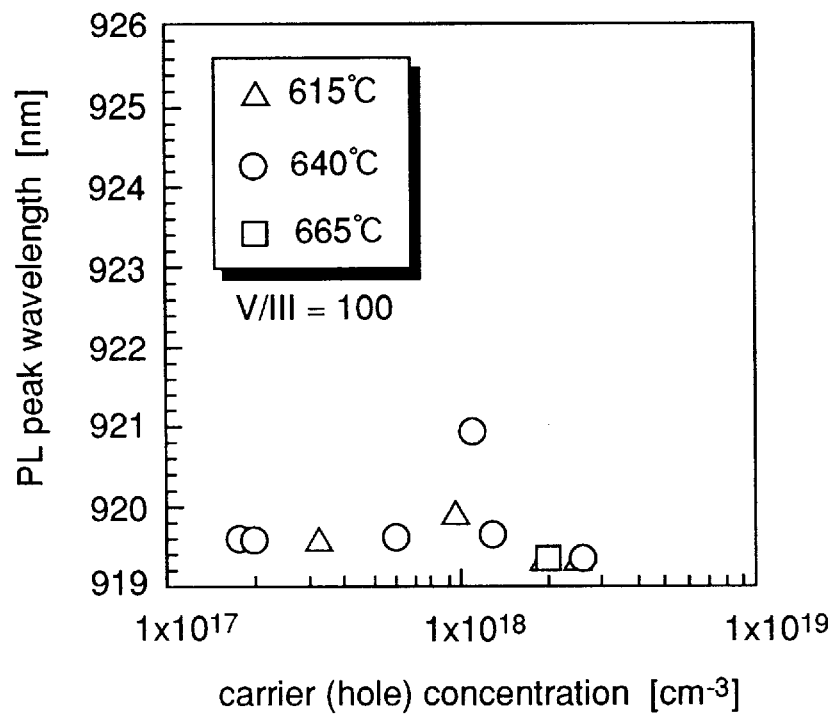
FIG. 6 is a graph showing a relation between hole concentration and PL peak wavelength, of Be doped InP grown while employing $(MeCP)_2Be$ as a dopant source.

FIG. 5 is a graph showing a relation between hole concentration and PL peak wavelength of a Be doped InP grown employing $(MeCP)_2Be$ as the dopant source and a Zn doped InP grown employing DEZn as the dopant source. As shown in FIG. 5, the PL peak wavelength of Zn doped InP is shifted to a long wavelength side as the hole concentration is increased, on the other hand, Be doped InP has a stable PL peak wavelength regardless of the hole concentration. FIG. 6 is a graph showing a relation between hole concentration and PL peak wavelength of Be doped InP grown employing $(MeCP)_2Be$ as the dopant source at respective different growth temperatures. In this figure, the dependency on the growth temperatures is not shown.

Figure 7:
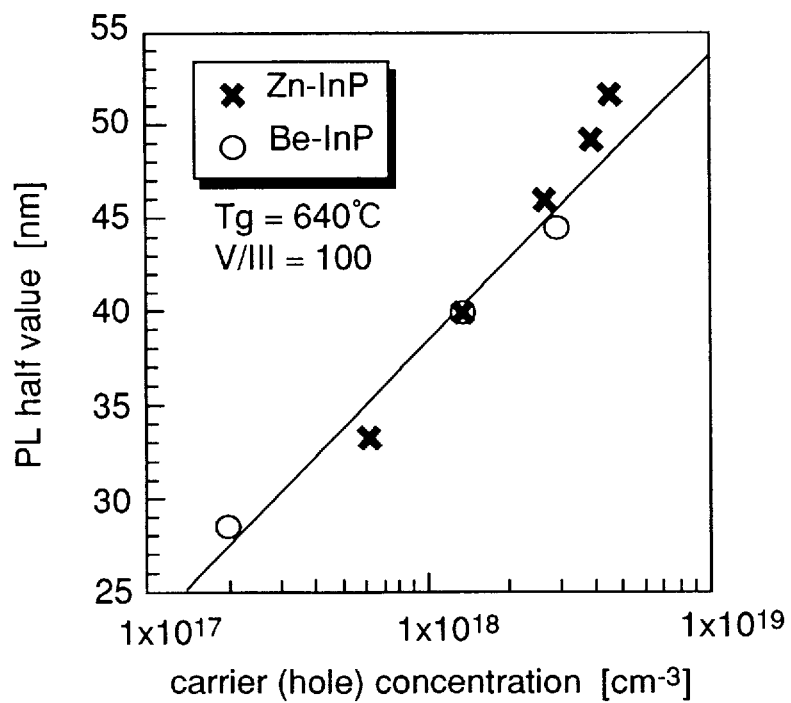
FIG. 7 is a graph showing a relation between hole concentration and PL half value, of Be doped InP grown by employing $(MeCP)_2Be$ as a dopant source and Zn doped InP grown while employing DEZn as a dopant source.
Figure 8:
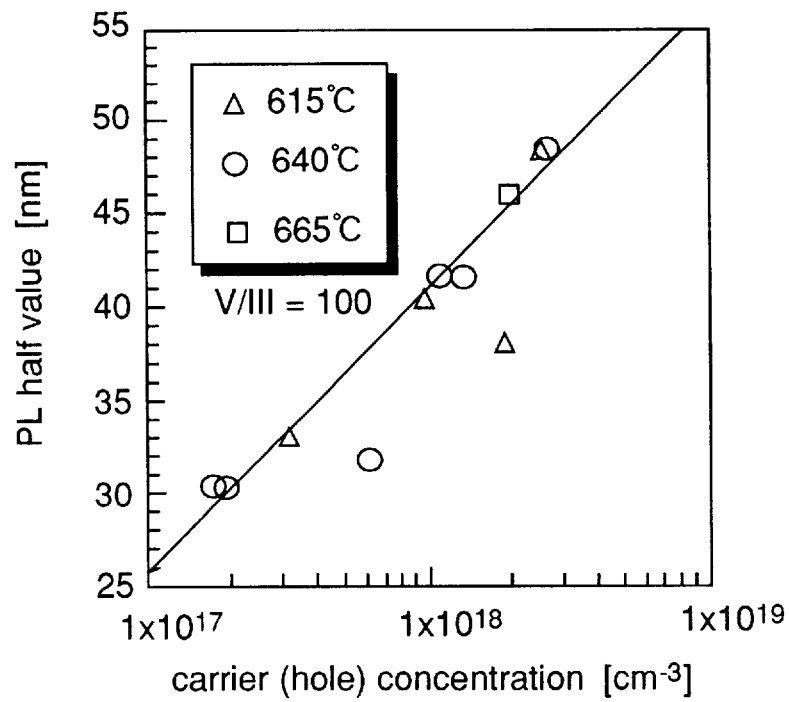
FIG. 8 is a graph showing a relation between hole concentration and PL half value, of Be doped InP grown while employing $(MeCP)_2Be$ as a dopant source.

FIG. 7 is a graph showing a relation between hole concentration and PL half value of Be doped InP grown employing $(MeCP)_2Be$ as the dopant source and Zn doped InP grown employing DEZn as the dopant source. As shown in FIG. 7, in each of Zn doped InP and Be doped InP, the PL half value is increased with an increase in the hole concentration. Further, FIG. 8 is a graph showing a relation between a hole concentration and a PL half value of Be doped InP grown employing $(MeCP)_2Be$ as the dopant source at respective different growth temperature. In this figure, the dependency on the growth temperature is not shown.

Figure 9:
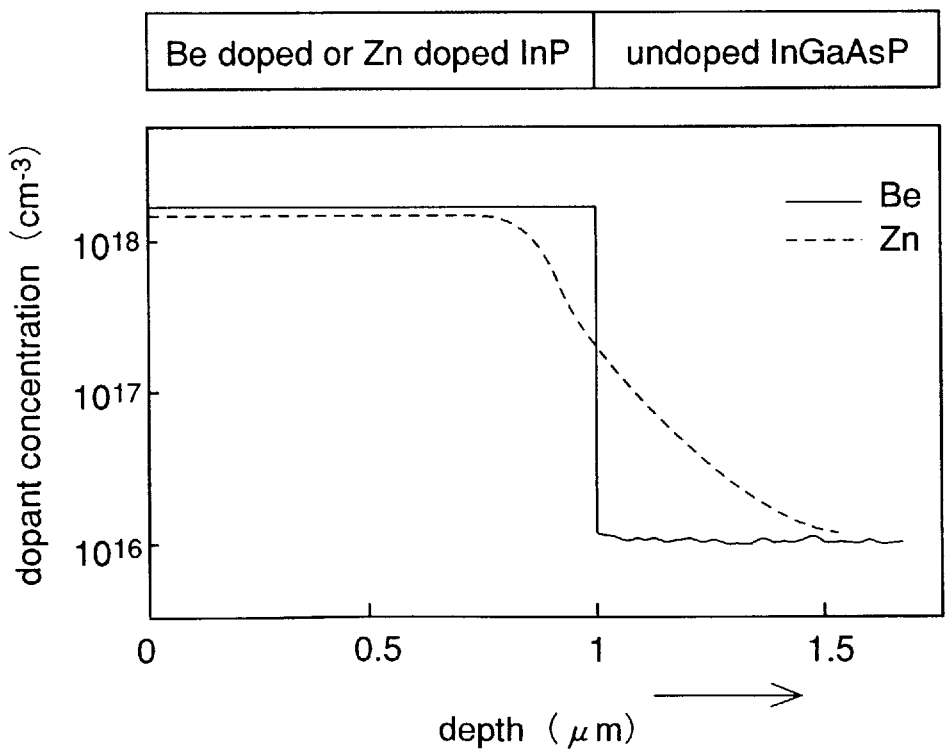
FIG. 9 is a graph showing a result of SIMS measuring p type dopant profile of Be and Zn when a Be doped InP layer and a Zn doped InP layer are grown on an undoped InGaAsP layer in a depth direction from the surface of the grown layer.

FIG. 9 is a graph showing a result of SIMS measurement of p type dopant profiles of Be and Zn when a Be doped InP layer and a Zn doped InP layer are respectively grown on an undoped InGaAsP layer, in the depth direction from the surface of the grown layer. As shown in FIG. 9, Zn does not provide a p type dopant profile sharply changing at the undoped-InGaAsP/Zn-doped InP interface because it diffuses into the undoped InGaAsP layer. On the contrary, Be provides a p type dopant profile sharply changing at the undoped-InGaAsP/Be-doped InP interface. This result is attributed to the fact that the diffusion coefficient of Be is considerably smaller than that of Zn. For example, it is $4 \times 10^{-16}$ cm$^{-2}$/s at 725° C. in GaAs. As shown in FIGS. 7 and 8, even in a case where Be doping is performed by the method according to the first embodiment of the invention, the PL half value is increased with an increase in the hole concentration. Therefore, when Be is employed as a p type dopant for a p type cladding layer of a semiconductor laser, if a large amount of Be atoms diffuse into the active layer, the laser characteristics should be adversely affected, as in the case of employing Zn as the p type dopant. However, as seen from FIG. 9, since Be atoms are not diffused into the active layer in large quantities when Be is used as a p type dopant for the p type cladding layer, the degradation of the laser characteristics, which is a problem when Zn is employed as the p type dopant, is avoided.

As described above, since (MeCP)$_2$Be is employed as the dopant source for doping an InP layer when the InP layer is epitaxially grown, (MeCP)$_2$ vapor pressure than the organic metal compound, diethylberyllium (DEBe), that is conventionally employed as the source of beryllium, whereby doping control is facilitated. In addition, since (MeCP)$_2$Be of higher purity than DEBe is easily obtained, impurities such as oxygen can be easily prevented from being incorporated into the crystal during doping, whereby a high quality p type layer is realized.

While in this embodiment Be doping of InP is described, the Be doping can be applied to all III-V compound semiconductors, such as InP, AlGaAs, AlGaInP, and GaN.

The crystal growth method to which the present invention can be applied is not restricted to MOCVD. It may be applied to other crystal growth methods that can employ (MeCP)$_2$Be as the dopant source, for example, MOMBE and CBE.

Embodiment 2

Figure 10:
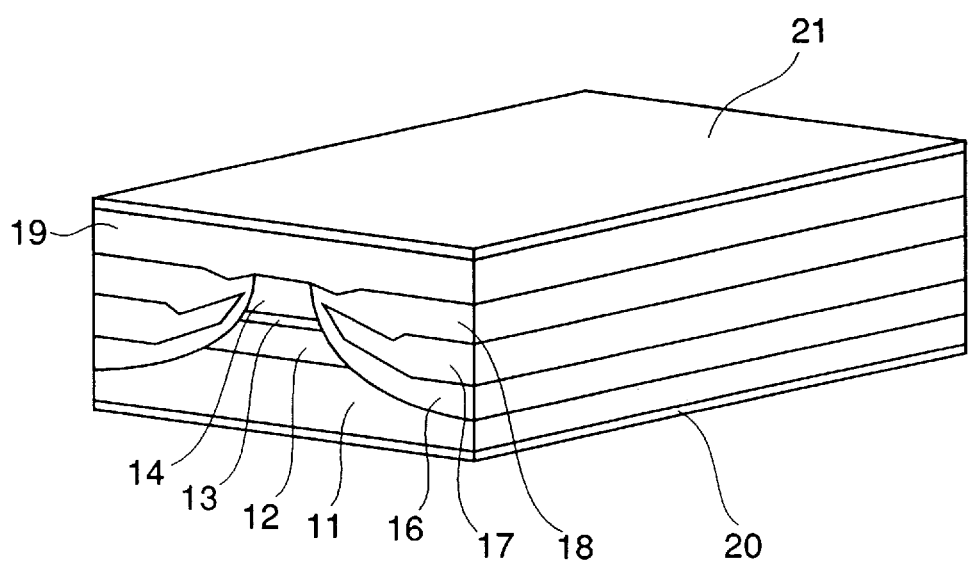
FIG. 10 is a perspective view illustrating a semiconductor long wavelength laser employing a p type InP substrate fabricated by a method according to a second embodiment of the present invention.

FIG. 10 is a perspective view illustrating an InP series semiconductor laser fabricated by a method for fabricating a semiconductor optical element according to a second embodiment of the present invention. FIGS. 11(a)–11(e) are perspective views illustrating process steps in the method therefor. In FIG. 10, reference numeral 11 designates a p type InP substrate having a (100) surface. A Be doped p type InP cladding layer 12 is disposed on the substrate 11, an undoped InGaAs active layer 13 is disposed on the p type InP cladding layer 12, and an S doped n type InP cladding layer 14 is disposed on the active layer 13. The n type cladding layer 14, the active layer 13, and the p type cladding layer 12 are respectively formed in a mesa shape by etching reaching the substrate 11. Be doped p type InP buffer layers 16, S doped n type InP current blocking layers 17, and Be doped p type InP current blocking layers 18 are successively disposed at opposite sides of the mesa to bury the mesa. An S doped n type InP contact layer 19 is disposed on the mesa and on the p type InP current blocking layer 18. A p side electrode 20 and an n side electrode 21 are disposed on the rear surface of the substrate 11 and on the surface of the contact layer 19, respectively.

Figure 11:
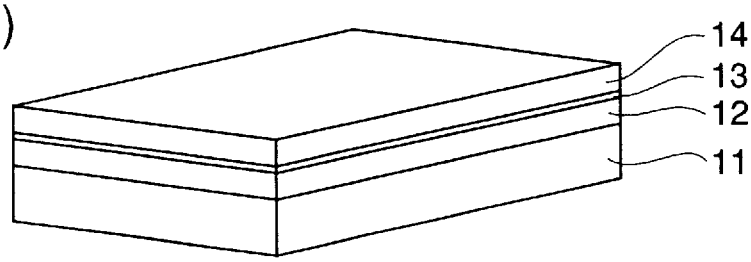
FIGS. 11(a)–11(e) are perspective views illustrating process steps in a method of fabricating a semiconductor optical element according to the second embodiment of the present invention.
Figure 11:
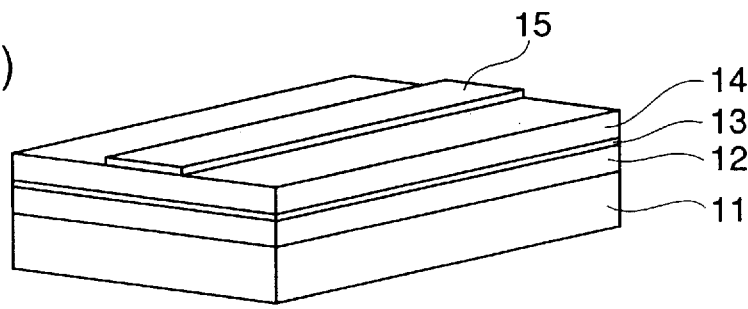
Figure 11:
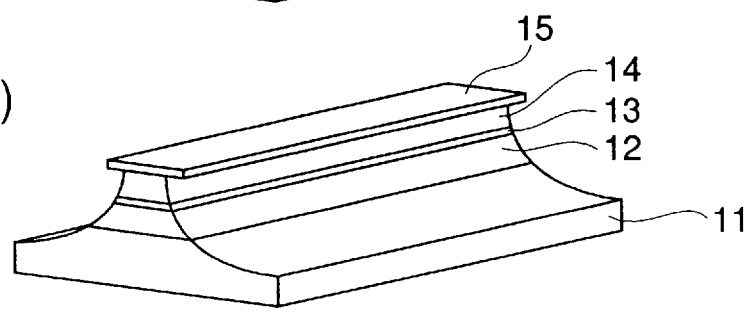
Figure 11:
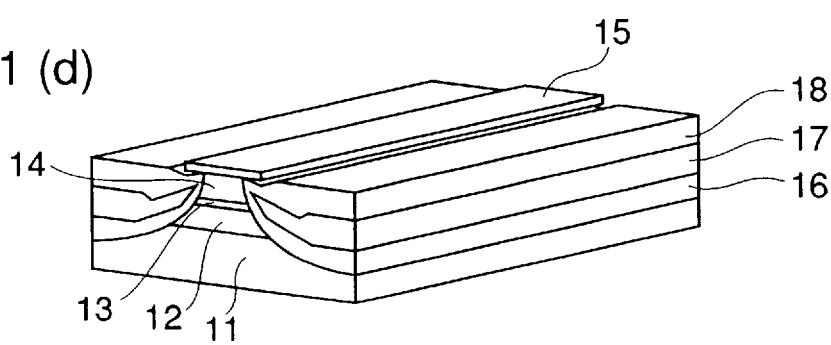
Figure 11:
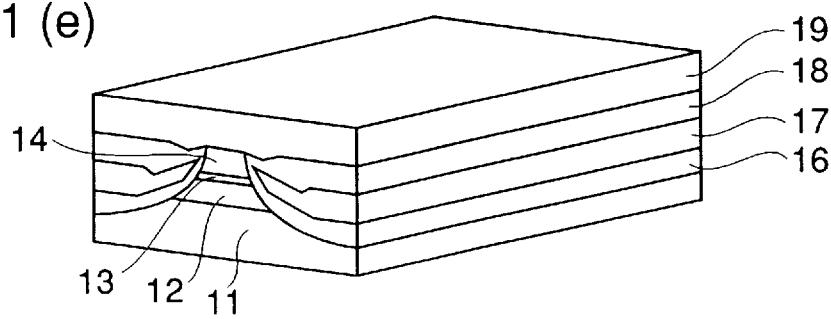

Initially, on the p type InP substrate 11 including Zn in a concentration of $3-5 \times 10^{18}$cm$^{-3}$ as a dopant and having a (100) surface, the Be doped p type InP cladding layer 12 having a p type dopant concentration of $1 \times 10^{18}$cm$^{-3}$, the undoped InGaAs active layer 13, and the S doped n type InP cladding layer 14 having an n type dopant concentration of $1 \times 10^{18}$cm$^{-3}$ are successively and epitaxially grown by MOCVD (FIG. 11(a)). In the typical thicknesses of the respective layers, the p type InP cladding layer 12 is 2 μm, the undoped InGaAs active layer 13 is 0.1 μm, and the n type InP cladding layer 14 is 0.5 μm.

The crystal growth temperature is 640° C., and the source gases employed for the crystal growth are trimethylindium (TMI) for In, triethylgallium (TEG) for Ga, arsine (AsH$_3$) for As, and phosphine (PH$_3$) for P, respectively. In addition, (MeCP)$_2$Be is employed as a source gas for Be doping and H$_2$S is employed as a source gas for S doping, respectively. V/III ratio is about 100.

A stripe-shaped SiO$_2$ mask 15 is formed in <011> direction by sputtering, photolithography, and chemical etching employing HF as an etchant (FIG. 11(b)). Further, the mesa structure is formed by chemical etching employing an HBr series etchant (FIG. 11(c)).

Employing metal organic vapor phase epitaxy (MOVPE), the Be doped p type InP buffer layer 16 having a p type dopant concentration of $7 \times 10^{17}$cm$^{-3}$, the S doped n type InP current blocking layer 17 having an n type dopant concentration of $7 \times 10^{18}$cm$^{-3}$, and the Be doped InP current blocking layer 18 having a p type dopant concentration of $7 \times 10^{17}$cm$^{-3}$ are successively selectively grown at opposite sides of the mesa to bury the mesa (FIG. 11(d)).

In the typical thicknesses of the respective layers, the p type InP buffer layer 16 is 0.7 μm, the n type InP current blocking layer 17 is 0.8 μm, and the p type InP current blocking layer 18 is 1 μm.

After removal of the SiO$_2$ mask 15 by chemical etching, an S doped n type InP contact layer 19 having an n type dopant concentration of $7 \times 10^{18}$cm$^{-3}$ is epitaxially grown by MOCVD (FIG. 11(e)). The typical thickness of the n type InP contact layer 19 is 2 μm. Thereafter, the p side electrode 20 is formed on the rear surface of the substrate 11 and the n side electrode 21 is formed on the contact layer 19, respectively. Further, facets are formed by cleaving, thereby completing a semiconductor laser shown in FIG. 10.

In the above-described semiconductor laser, since diffusion of Be as the p type dopant is sufficiently small, the linearity of the device and strain characteristics are improved, without degradation of optical characteristics due into diffusion of Be to the undoped InGaAsP active layer 13. Further, since diffusion of Be into the active layer is reduced, the carrier concentration of the p type cladding layer is increased to $3 \times 10^{18}$cm$^{-3}$, thereby reducing resistance of the device and realizing high-power output.

According to the second embodiment, since (MeCP)$_2$Be is employed as the dopant source for Be doping, doping control is facilitated and a high quality p type layer is easily realized, whereby the characteristics of the device are further improved.

Embodiment 3

Figure 12:
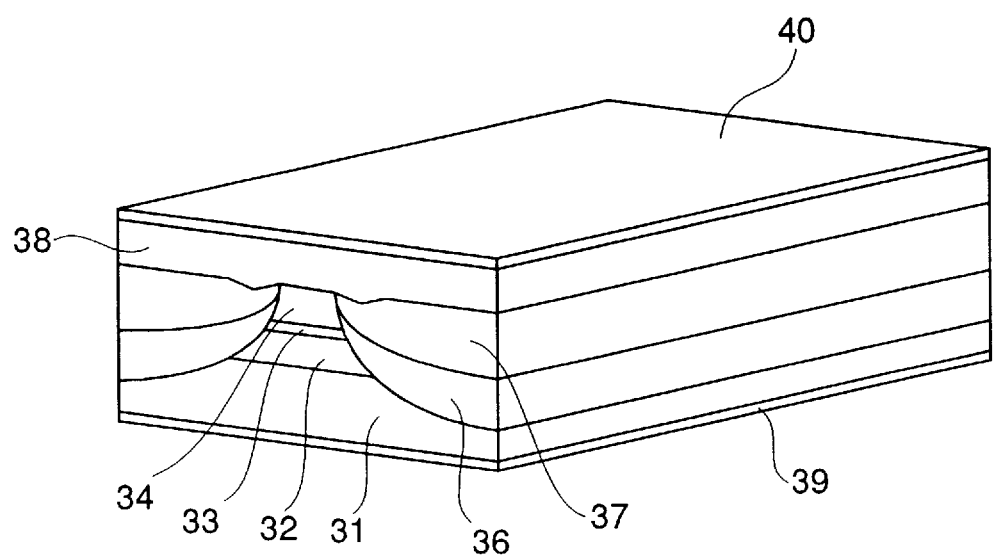
FIG. 12 is a perspective view illustrating a semiconductor long wavelength buried laser employing an n type InP substrate fabricated by a method for fabricating a semiconductor optical element according to a third embodiment of the present invention.

FIG. 12 is a perspective view illustrating another InP series semiconductor laser fabricated by a method for fabricating a semiconductor optical element according to a third embodiment of the present invention, and FIGS. 13(a)–13(e) are perspective views illustrating process steps in the fabricating method therefor. In FIG. 12, reference numeral 31 designates an n type InP substrate having a (100) surface. An S doped n type InP cladding layer 32 is disposed on the substrate 31, an undoped InGaAs active layer 33 is disposed on the n type InP cladding layer 32, and a Be doped p type InP cladding layer 34 is disposed on the active layer 33. The p type cladding layer 34, the active layer 33, and the n type cladding layer 32 are respectively formed in a mesa shape by etching reaching the substrate 31. Be doped p type InP current blocking layers 36 and S doped n type InP current blocking layers 37 are successively disposed at opposite sides of the mesa to bury the mesa. A Be doped p type InP contact layer 38 is disposed on the mesa and on the n type InP current blocking layer 37. An n side electrode 39 and a p side electrode 40 are disposed on the rear surface of the substrate 31 and on the surface of the contact layer 38, respectively.

Initially, on the n type InP substrate 31 having a (100) surface, the S doped n type InP cladding layer 32 having an n type dopant concentration of $1\times10^{18}cm^{-3}$, the undoped InGaAs active layer 33, and the Be doped p type InP cladding layer 34 having a p type dopant concentration of $1\times10^{18}cm^{-3}$ are successively and epitaxially grown. In the typical thicknesses of the respective layers, the n type InP cladding layer 32 is 1 μm, the undoped InGaAs active layer 33 is 0.1 μm, and the p type InP cladding layer 34 is 0.5 μm, (FIG. 13(a)).

The crystal growth temperature is 640° C., and the source gases employed for the crystal growth are trimethylindium (TMI) for In, triethylgallium (TEG) for Ga, arsine (AsH$_3$) for As, and phosphine (PH$_3$) for P, respectively. In addition, (MeCP)$_2$Be is employed as a source gas for Be doping and H$_2$S is employed as a source gas for S doping, respectively. V/III ratio is about 100.

Figure 13:
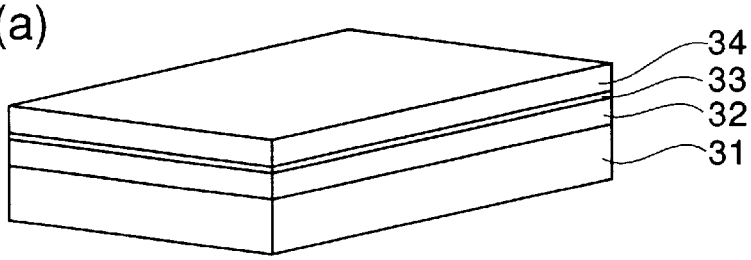
FIGS. 13(a)–13(e) are perspective views illustrating process steps in a method of fabricating a semiconductor optical element according to the third embodiment of the present invention.
Figure 13:
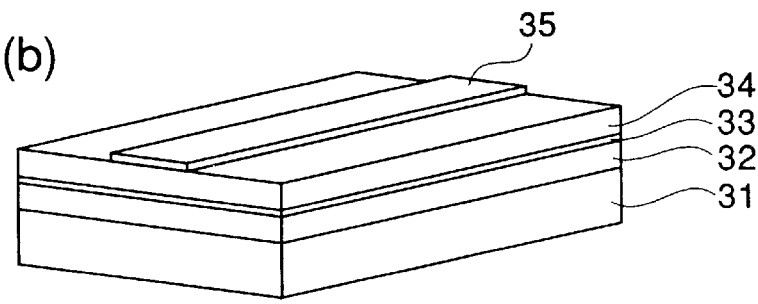
Figure 13:
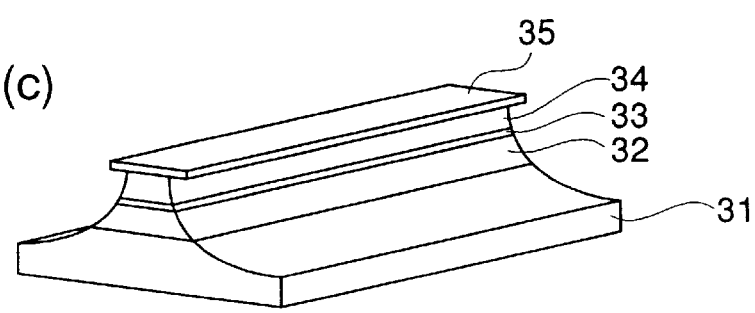
Figure 13:
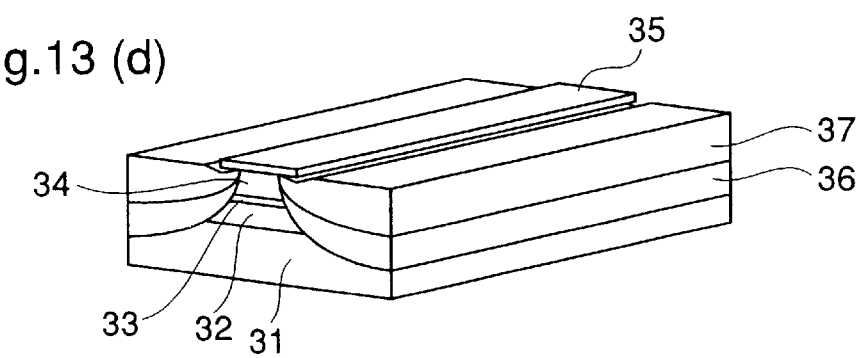
Figure 13:
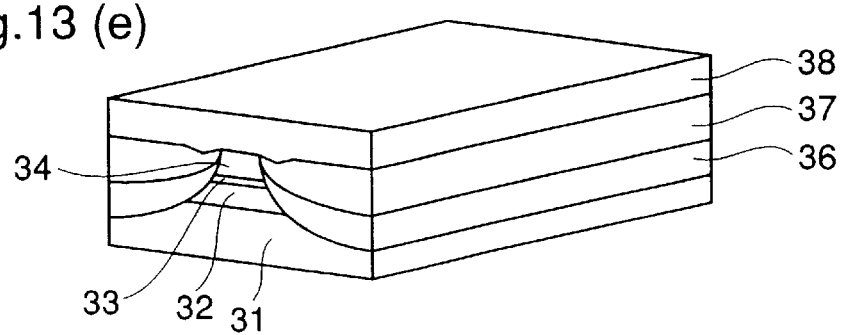

A stripe-shaped SiO$_2$ mask 35 is formed in <011> direction by sputtering, photolithography, and chemical etching employing HF as an etchant (FIG. 13(b)). Further, a mesa structure is formed by chemical etching employing an HBr series etchant (FIG. 13(c)).

Employing MOCVD, the Be doped p type InP current blocking layer 36 having a p type dopant concentration of $7\times10^{17}cm^{-3}$ and the S doped n type InP current blocking layer 37 having an n type dopant concentration of $7\times10^{18}cm^{-3}$ are successively selectively grown at opposite sides of the mesa to bury the mesa (FIG. 13(d)).

In the typical thicknesses of respective layers, the p type InP current blocking layer 36 is 1 μm and the n type InP current blocking layer 37 is 1 μm.

After removal of the SiO$_2$ mask 35 by chemical etching, the Be doped p type InP contact layer 38 having a p type dopant concentration of $1\times10^{18}cm^{-3}$ is epitaxially grown by MOCVD (FIG. 13(e)). The typical thickness of the p type InP contact layer 38 is 2 μm. Thereafter, the n side electrode 39 is formed on the rear surface of the substrate 31 and the p side electrode 40 is formed on the contact layer 38. Further, facets are formed by cleaving, thereby completing a semiconductor laser shown in FIG. 12.

In the above-described semiconductor laser, since diffusion of Be as the p type dopant is sufficiently small, the optical characteristics are not degraded by diffusion of Be into the undoped InGaAs active layer 33.

According to the third embodiment, since (MeCP)$_2$Be is employed as the dopant source for Be doping, doping control is facilitated and a high quality p type layer is easily realized, whereby the characteristics of the device are further improved.

It is possible to use the structures shown in FIGS. 10 and 12 according to the above-described second and third embodiments as a modulator by applying a reverse bias voltage. In this case, since diffusion of Be is reduced, the carrier concentration of the undoped active layer becomes less than $5\times10^{16}cm^{-3}$, whereby light absorption in the active layer is suppressed, resulting in a large extinction ratio.

Embodiment 4

Figure 14:
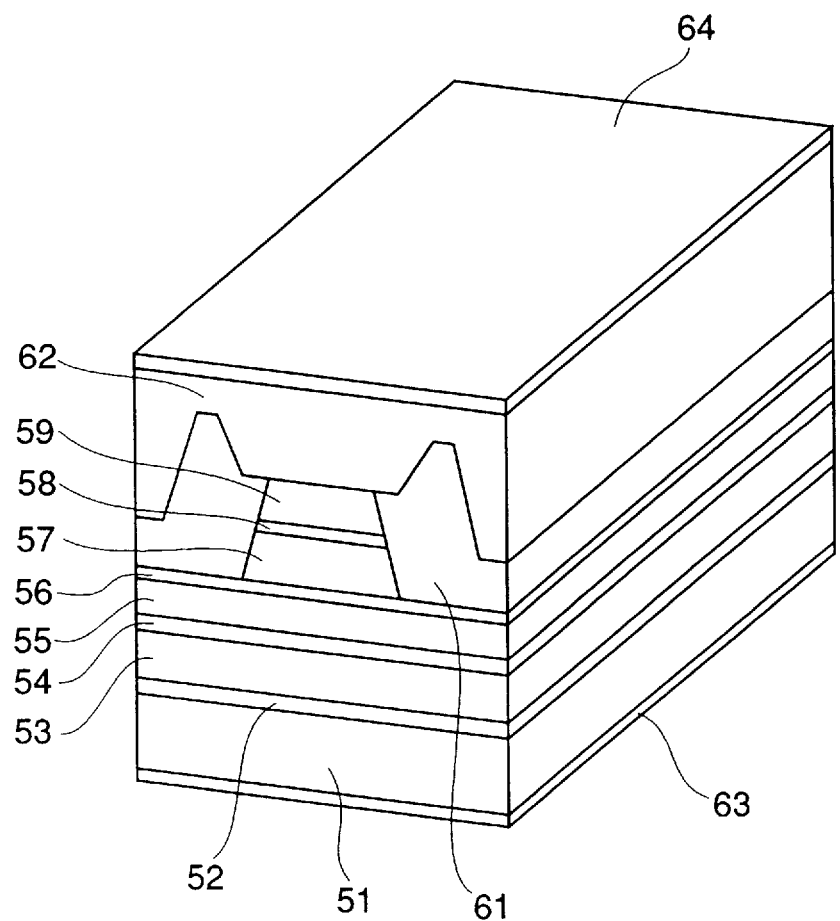
FIG. 14 is a perspective view illustrating a semiconductor visible light laser employing an n type GaAs substrate fabricated by a method for fabricating a semiconductor optical element according to a fourth embodiment of the present invention.

FIG. 14 is a perspective view illustrating an AlGaInP series semiconductor laser fabricated by a method for fabricating a semiconductor optical element according to a fourth embodiment of the present invention, and FIGS. 15(a)–15(e) are perspective views illustrating process steps in the fabricating method therefor. In FIG. 14, reference numeral 51 designates an n type GaAs substrate having a (100) surface. An Si doped n type GaAs buffer layer 52, an Si doped n type AlGaInP cladding layer 53, an undoped GaInP active layer 54, a Be doped p type AlGaInP cladding layer 55, and a Be doped p type GaInP etching stopper layer 56 are successively laminated on the substrate 51. A Be doped p type AlGaInP cladding layer 57 is disposed on the etching stopper layer 56, a Be doped p type GaInP band discontinuity relaxing layer 58 is disposed on the p type AlGaInP cladding layer 57, and a Be doped p type GaAs cap layer 59 is disposed on the band discontinuity relaxing layer 58. The cap layer 59, the band discontinuity relaxing layer 58, and the p type cladding layer 57 are formed in a ridge stripe shape. Si doped n type GaAs current blocking layers 61 are disposed on the etching stopper layer 56 at opposite sides of the ridge stripe to bury the ridge stripe. A Be doped p type GaAs contact layer 62 is disposed on the ridge and on the n type GaAs current blocking layer 61. An n side electrode 63 and a p side electrode 64 are disposed on the rear surface of the substrate 51 and on the surface of the contact layer 62, respectively.

Figure 15:
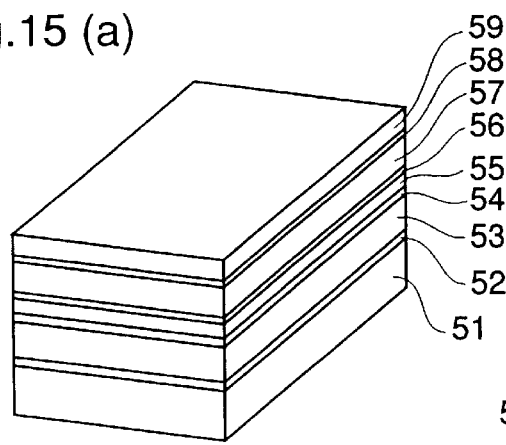
FIGS. 15(a)–15(e) are perspective views illustrating process steps in a method of fabricating a semiconductor optical element according to the fourth embodiment of the present invention.
Figure 15:
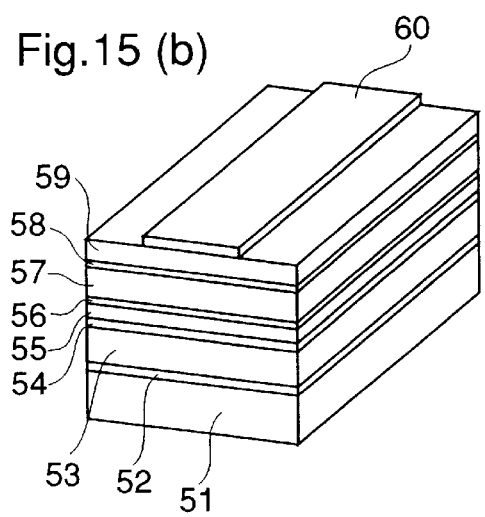
Figure 15:
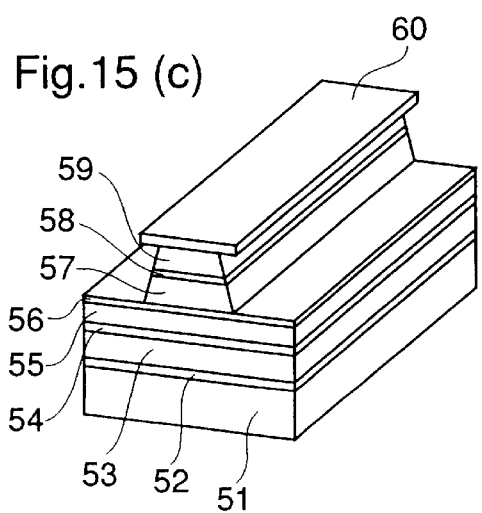
Figure 15:
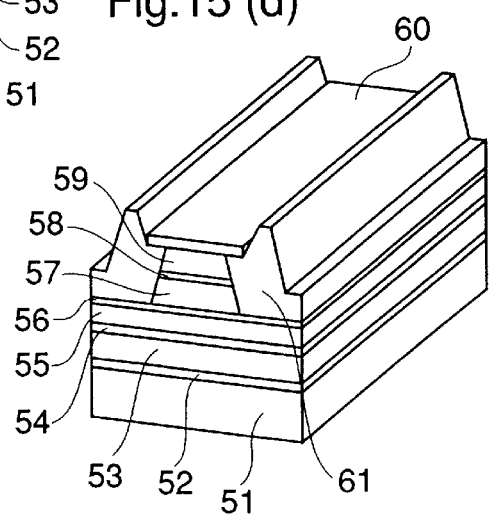
Figure 15:
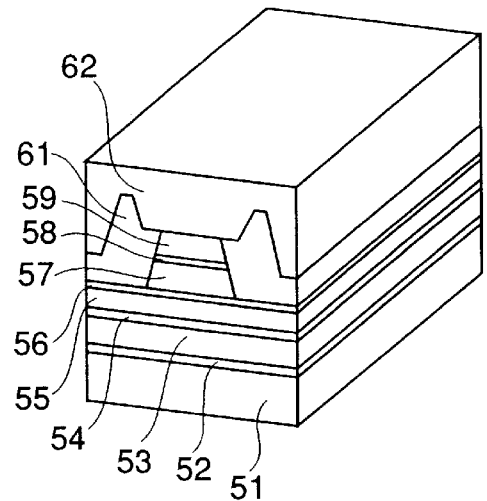

Initially, on the n type GaAs substrate 51 having a (100) surface, the Si doped n type GaAs buffer layer 52, the Si doped n type Al$_{0.35}$Ga$_{0.15}$In$_{0.5}$P cladding layer 53 having an n type dopant concentration of $4\times10^{17}cm^{-3}$, the undoped GaInP active layer 54, the Be doped p type Al$_{0.35}$Ga$_{0.15}$In$_{0.5}$P cladding layer 55 having a p type dopant concentration of $7\times10^{17}cm^{-3}$, the Be doped p type Ga$_{0.5}$In$_{0.5}$P etching stopper layer 56 having a p type dopant concentration of $1\times10^{18}cm^{-3}$, the Be doped p type Al$_{0.35}$Ga$_{0.15}$In$_{0.5}$P cladding layer 57 having a p type dopant concentration of $9\times10^{17}cm^{-3}$, the Be doped p type Ga$_{0.5}$In$_{0.5}$P band discontinuity relaxing layer 58 having a p type dopant concentration of $3\times10^{18}cm^{-3}$, and the Be doped p type GaAs cap layer 59 having a p type dopant concentration of $1\times10^{19}cm^{-3}$ are successively and epitaxially grown (FIG. 15(a)). In the typical thicknesses of the respective layers, the buffer layer 52 is 0.5 μm, the n type cladding layer 53 is 1.5 μm, the active layer 54 is 700 Å (70 nm), the p type cladding layer 55 is 0.25 μm, the etching stopper layer 56 is 50 Å (5 nm), the p type cladding layer 57 is 1.4 μm, the band discontinuity relaxing layer 58 is 0.1 μm, and the cap layer 59 is 0.4 μm.

The crystal growth temperature is 700° C., and the source gases employed for the crystal growth are trimethylaluminium (TMA) for Al, trimethylindium (TMI) for In, phosphine (PH$_3$) for P, and arsine (AsH$_3$) for As, respectively. In addition, as for Ga, trimethylgallium (TMA) is employed during growth of GaAs and triethylgallium (TEG) is employed during growth of other Ga compound semiconductor layers. Further, (MeCP)$_2$Be is employed as a source gas for Be source and SiH$_4$ is employed as a doping gas for Si doping, respectively. V/III ratio is 200 during growth of AlGaInP and 400 during growth of GaInP.

A stripe-shaped SiN mask 60 is formed in <01$\bar{1}$> direction by sputtering, photolithography, and chemical etching (FIG. 15(b)). Further, the ridge structure is formed by chemical etching (FIG. 15(c)).

Employing MOCVD to the ridge structure, the Si doped n type GaAs current blocking layers 61 each having an n type dopant concentration of 4×10$^{18}$cm$^{-3}$ is selectively grown at opposite sides of the ridge to bury the ridge (FIG. 15(d)). The typical thickness of the current blocking layer 61 is 1.2 µm.

After removal of the SiN mask 60 by chemical etching, a Be doped p type GaAs contact layer 62 having a p type dopant concentration of 1×10$^{19}$cm$^{-3}$ is epitaxially grown by MOCVD (FIG. 15(e)). The typical thickness of the contact layer 62 is 2 µm. Thereafter, the n side electrode 63 is formed on the rear surface of the substrate 51 and the p side electrode 64 is formed on the contact layer 62, respectively. Further, facets are formed by cleaving, thereby completing a semiconductor laser shown in FIG. 14.

In the semiconductor laser fabricated as described above, since diffusion of Be as the p type dopant is sufficiently small, the optical characteristics are not degraded due to diffusion of Be into the undoped GaInP active layer 54. In addition, when Zn is employed for the dopant, the carrier concentration of the p type cladding layer cannot be increased because Zn is diffused into the active layer and adversely affects the device characteristics when Zn concentration in the p type cladding layer exceeds 9×10$^{17}$cm$^{-3}$. On the contrary, when Be is employed for the dopant, the diffusion of the p type dopant is suppressed and the carrier concentration of the p type cladding layer is increased, whereby a high-speed and high-output power device is realized.

According to the fourth embodiment, as in the second and third embodiments, since (MeCP)$_2$Be is employed as the dopant source for Be doping, doping control is facilitated and a high quality p type layer is easily realized, whereby the characteristics of the device are further improved.

Embodiment 5

Figure 16:
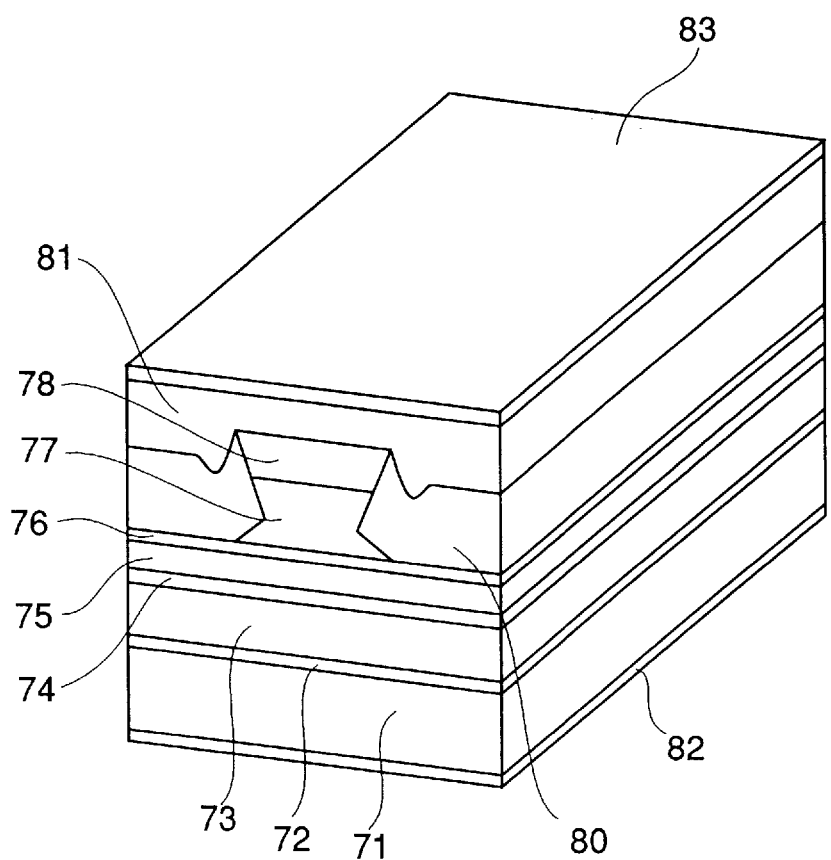
FIG. 16 is a perspective view illustrating a semiconductor short wavelength laser employing an n type GaAs substrate fabricated by a method for fabricating a semi conductor optical element according the fifth embodiment of the present invention.

FIG. 16 is a perspective view illustrating an AlGaAs series semiconductor laser fabricated by a method for fabricating a semiconductor optical element according to a fifth embodiment of the present invention, and FIGS. 17(a)–17(e) are perspective views illustrating process steps in the fabricating method therefor. In FIG. 16, reference numeral 71 designates an n type GaAs substrate having a (100) surface. An Se doped n type GaAs buffer layer 72, an Se doped n type Al$_{0.48}$Ga$_{0.52}$As cladding layer 73, an undoped Al$_{0.1}$Ga$_{0.9}$As/Al$_{0.35}$Ga$_{0.65}$As active layer 74, a Be doped p type Al$_{0.48}$Ga$_{0.52}$As cladding layer 75, and a Be doped p type Al$_{0.7}$Ga$_{0.3}$As etching stopper layer 76 are successively laminated on the substrate 71. A Be doped p type Al$_{0.48}$Ga$_{0.52}$As cladding layer 77 is disposed on the etching stopper layer 76 and a Be doped p type GaAs cap layer 78 is disposed on the cladding layer 77. The cap layer 78 and the p type cladding layer 77 are formed in ridge stripe shape. Si doped n type GaAs current blocking layers 80 are disposed on the etching stopper layer 76 at opposite sides of the ridge stripe to bury the ridge stripe. A Be doped p type GaAs contact layer 81 is disposed on the ridge and on the n type GaAs current blocking layer 80. An n side electrode 82 and a p side electrode 83 are disposed on the rear surface of the substrate 71 and on the surface of the contact layer 81, respectively.

Figure 17:
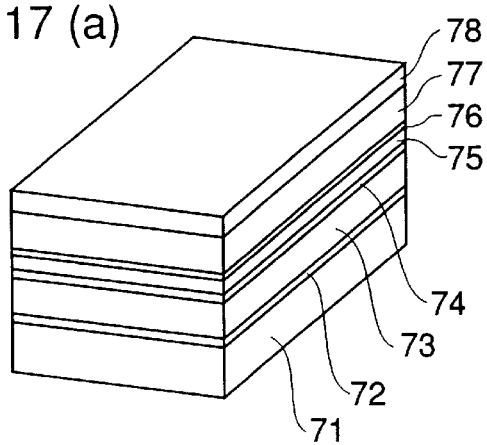
FIGS. 17(a)–17(e) are perspective views illustrating process steps in a method of fabricating a semiconductor optical element according to the fifth embodiment of the present invention.
Figure 17:
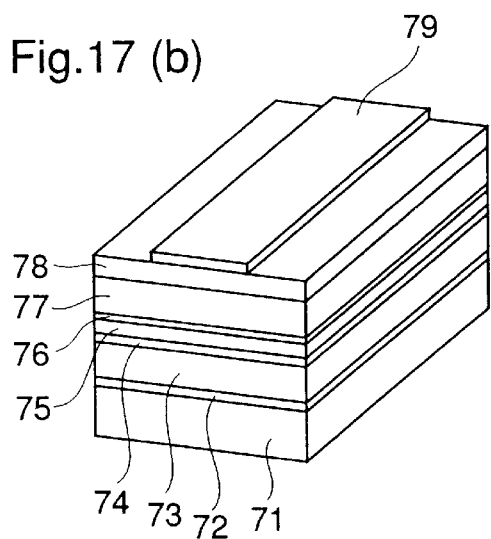
Figure 17:
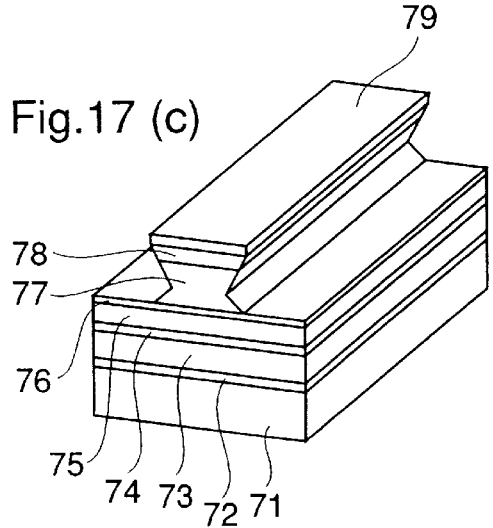
Figure 17:
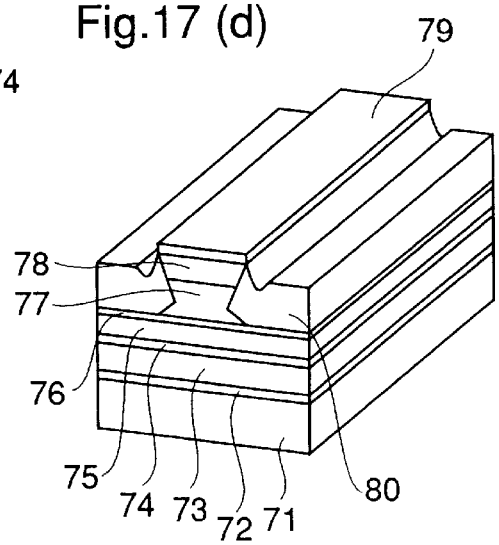
Figure 17:
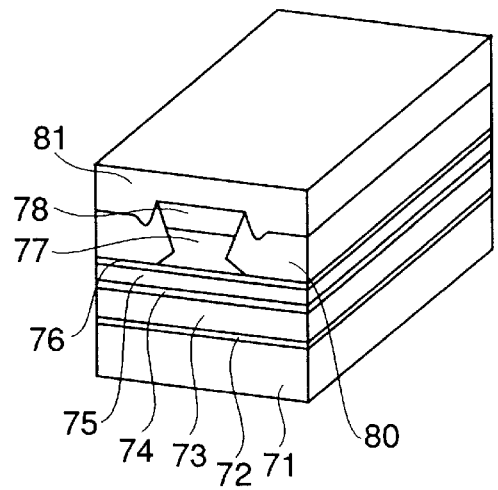

Initially, on the n type GaAs substrate 71 having a (100) surface, the Se doped n type GaAs buffer layer 72 having an n type dopant concentration of 1×10$^{18}$cm$^{-3}$, the Se doped n type Al$_{0.48}$Ga$_{0.52}$As cladding layer 73 having an n type dopant concentration of 4×10$^{17}$cm$^{-3}$, the undoped Al$_{0.1}$Ga$_{0.9}$As/Al$_{0.35}$Ga$_{0.65}$As active layer 74, the Be doped p type Al$_{0.48}$Ga$_{0.52}$As cladding layer 75 having a p type dopant concentration of 2×10$^{18}$cm$^{-3}$, the Be doped p type Al$_{0.7}$Ga$_{0.3}$As etching stopper layer 76, the Be doped p type Al$_{0.48}$Ga$_{0.52}$As cladding layer 77 having a p type dopant concentration of 2×10$^{18}$cm$^{-3}$, and the Be doped p type GaAs cap layer 78 having a p type dopant concentration of 1×10$^{19}$cm$^{-3}$ are successively and epitaxially grown (FIG. 17(a)). In the typical thicknesses of the respective layers, the n type buffer layer 72 is 1 µm, the n type cladding layer 73 is 1.5 µm, the active layer 74 is 0.1 µm, the p type cladding layer 75 is 0.3 µm, the etching stopper layer 76 is 50 Å (5 nm), the p type cladding layer 77 is 1.1 µm, and the cap layer 78 is 0.7 µm.

The crystal growth temperature is 675° C., and the source gases employed for the crystal growth are trimethylaluminium (TMA) for Al, trimethylgallium (TMG) for Ga, and arsine (AsH$_3$) for As, respectively. Further, (MeCP)$_2$Be is employed as a source gas for Be doping, H$_2$Se is employed as a source gas for Se doping, and SiH$_4$ is employed as a source gas for Si doping, respectively. V/III ratio is about 200.

A stripe-shaped SiON mask 79 is formed in a <011> direction by sputtering, photolithography, and chemical etching (FIG. 17(b)). Further, the ridge structure is formed by chemical etching (FIG. 17(c)).

Employing MOCVD to the ridge structure, the Si doped n type GaAs current blocking layers 80 having an n type dopant concentration of 5×10$^{18}$cm$^{-3}$ are selectively grown at opposite sides of the ridge stripe to bury the ridge stripe (FIG. 17(d)). The typical thickness of the current blocking layer 80 is 1.5 µm.

After removal of the SiON mask 79 by chemical etching, the Be doped p type GaAs contact layer 81 having a p type dopant concentration of 1×10$^{19}$cm$^{-3}$ is epitaxially grown by MOCVD (FIG. 17(e)). The typical thickness of the contact layer 81 is 2.5 µm. Thereafter, the n side electrode 82 is formed on the rear surface of the substrate 71 and the p side electrode 83 is formed on the contact layer 81, respectively. Further, facets are formed by cleaving, thereby completing a semiconductor laser shown in FIG. 16.

In the above-described semiconductor laser, since diffusion of Be as the p type dopant is sufficiently small, the optical characteristics are not degraded by diffusion of Be into the undoped Al$_{0.1}$Ga$_{0.9}$As/Al$_{0.35}$Ga$_{0.65}$As active layer 74, thereby improving the reliability of the device.

According to the fifth embodiment, as in the second to fourth embodiments, since (MeCP)$_2$Be is employed as the dopant source for Be doping, doping control is facilitated and a high quality p type layer is easily realized, whereby the characteristics of the device are further improved.

Embodiment 6

Figure 18:
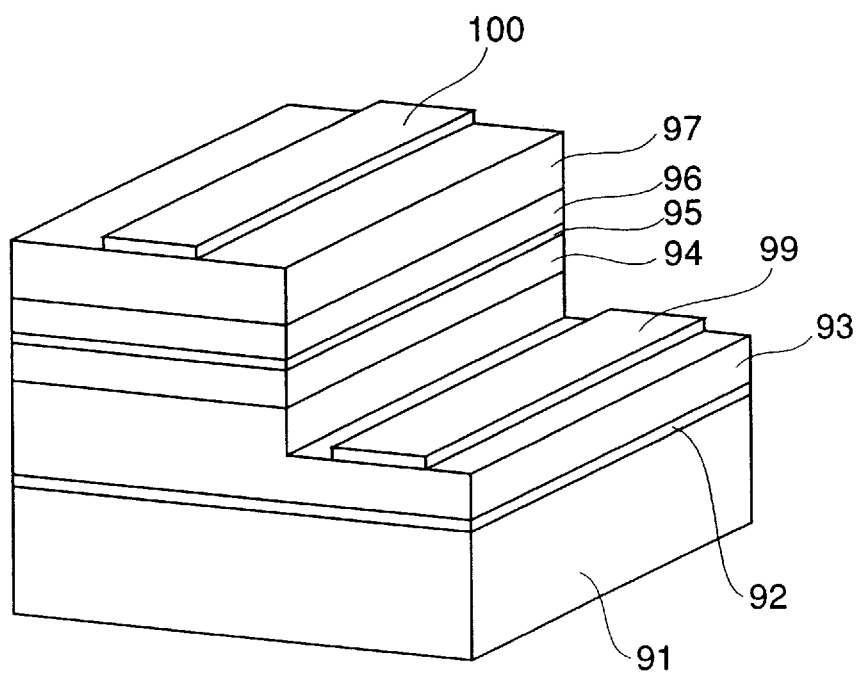
FIG. 18 is a perspective view illustrating a semiconductor blue light emission diode employing a sapphire substrate fabricated by a method for fabricating a semiconductor optical element according to a sixth embodiment of the present invention.
Figure 19:
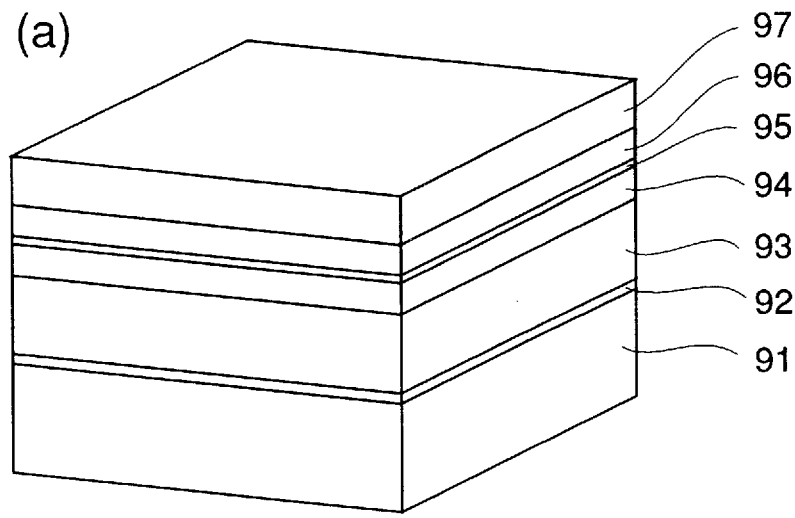
FIGS. 19(a)–19(c) are perspective views illustrating process steps in a method of fabricating a semiconductor optical element according to the sixth embodiment of the present invention.
Figure 19:
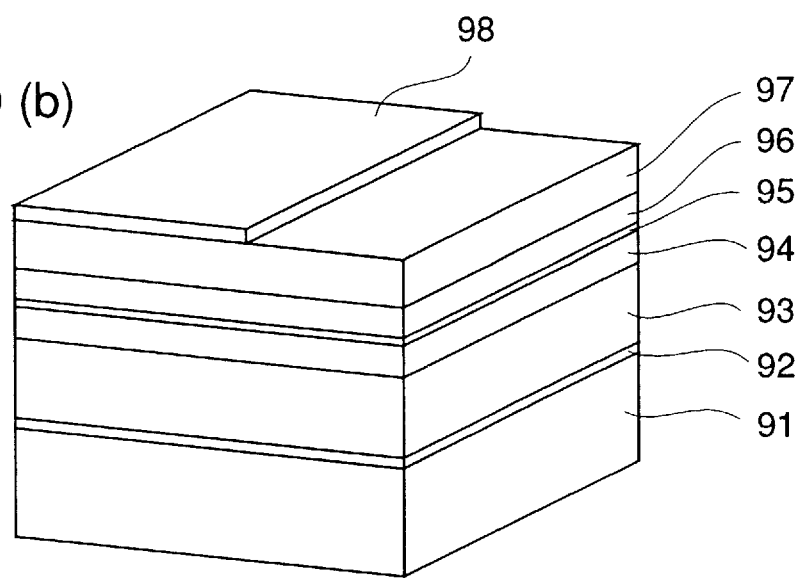
Figure 19:
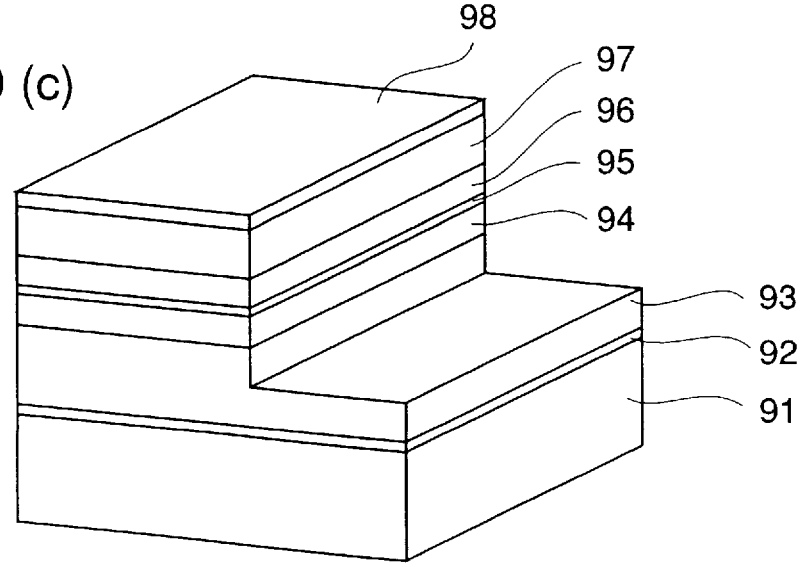

FIG. 18 is a perspective view illustrating a GaN series semiconductor blue light emission diode fabricated by a method for fabricating a semiconductor optical element according to a sixth embodiment of the present invention, and FIGS. 19(a)–19(c) are perspective views illustrating process steps in the fabricating method therefor. In FIG. 18, reference numeral 91 designates a sapphire substrate having a (0001) surface. An undoped GaN buffer layer 92, an Si doped n type GaN cladding layer 93, an Si doped n type AlGaN layer 94, a Zn doped InGaN active layer 95, a Be doped p type AlGaN layer 96, and a Be doped p type GaN layer 97 are successively laminated on the substrate 91. The portions of the p type GaN layer 97, the p type AlGaN layer 96, the InGaN active layer 95, the n type AlGaN layer 94, and the n type GaN cladding layer 93 are successively etched away by etching from the side of the p type GaN layer 97 reaching into the center of the n type GaN cladding layer 93, whereby the n type GaN cladding layer 93 is exposed at the portion removed by etching. An n side electrode 99 is disposed on the exposed n type GaN cladding layer 93 and a p side electrode 100 is disposed on the p type GaN layer 97, respectively.

Initially, on the sapphire substrate 91 having a (0001) surface, the undoped GaN buffer layer 92, the Si doped n type GaN cladding layer 93 having an n type dopant concentration of $5 \times 10^{18} cm^{-3}$, the Si doped n type AlGaN layer 94 having an n type dopant concentration of $5 \times 10^{18} cm^{-3}$, the Zn doped InGaN layer 95, the Be doped p type AlGaN layer 96 having a p type dopant concentration of $5 \times 10^{18} cm^{-3}$, and the Be doped p type GaN layer 97 having a p type dopant concentration of $8 \times 10^{18} cm^{-3}$ are successively and epitaxially grown (FIG. 19(a)). In the typical thicknesses of the respective layers, the GaN buffer layer 92 is 500 Å (50 nm), the n type GaN cladding layer 93 is 4 μm, the n type AlGaN layer 94 is 0.25 μm, the InGaN layer 95 is 500 Å (50 nm), the p type AlGaN layer 96 is 0.25 μm, and the p type GaN layer 97 is 0.5 μm.

The crystal growth temperature is 1000° C., and the source gases employed for the crystal growth are trimethylaluminium (TMA) for Al, trimethylgallium (TMG) for Ga, and ammonia ($NH_3$) for N, respectively. Further, $(MeCP)_2Be$ is employed as a source gas for Be doping, $SiH_4$ is employed as a source gas for Si doping, and DEZn is employed as a source gas for Zn doping, respectively. V/III ratio is about 1000.

After the crystal growth, resistance of the p type layer is reduced by annealing at 700° C. in the nitrogen atmosphere for one hour.

A mask 98 is formed by sputtering, photolithography, and chemical etching (FIG. 19(b)). Further, a step-like structure is formed by chemical etching as shown in FIG. 19(c).

After removal of the mask 98 by chemical etching, the n side electrode 99 and the p side electrode 100 are formed by sputtering and photolithography. Thereafter, the semiconductor light emission diode shown in FIG. 18 is formed in a chip dividing process.

In the above-described semiconductor light emission diode, since diffusion of Be as the p type dopant is sufficiently small, the optical characteristics are not degraded by diffusion of Be into the Zn doped InGaN layer 95, thereby realizing high-output power by reducing the resistance of the p type layer.

According to the sixth embodiment, as in the second to fifth embodiments, since $(MeCP)_2Be$ is employed as the dopant source for Be doping, doping control is facilitated and a high quality p type layer is easily realized, whereby the characteristics of the device are further improved.

What is claimed is:

1. A method of doping a III-V compound semiconductor crystal with beryllium during epitaxial growth of the III-V compound semiconductor comprising employing $(CH_3C_5H_4)_2Be$ as a source of beryllium.

2. The method of claim 1 including epitaxially growing the III-V compound semiconductor by one of metal organic chemical vapor deposition (MOCVD), metal organic molecular beam epitaxy (MOMBE), and chemical beam epitaxy (CBE).

3. A method for fabricating a semiconductor optical element by epitaxially growing a p type layer of a III-V compound semiconductor material and an n type layer of a III-V compound semiconductor material on a substrate comprising doping said p type layer with beryllium from $(CH_3C_5H_4)_2Be$.

4. The method of claim 3 wherein a p type InP substrate is employed as the substrate and including fabricating a semiconductor laser.

5. The method of claim 3 wherein an n type InP substrate is employed as the substrate and including fabricating a semiconductor laser.

6. The method of claim 3 wherein an n type GaAs substrate is employed as the substrate and including fabricating a semiconductor visible light laser.

7. The method of claim 3 wherein an n type GaAs substrate is employed as the substrate and including fabricating a semiconductor laser.

8. The method of claim 3 wherein a sapphire substrate is employed as the substrate and including fabricating a semiconductor blue light emission diode.

\* \* \* \* \*